United States Patent
Choi

(10) Patent No.: US 10,345,665 B2
(45) Date of Patent: Jul. 9, 2019

(54) ARRAY SUBSTRATE AND METHOD OF MANUFACTURING THE SAME, DISPLAY PANEL AND DISPLAY DEVICE

(71) Applicant: Boe Technology Group Co., Ltd., Beijing (CN)

(72) Inventor: Hyunsic Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/462,289

(22) PCT Filed: Oct. 13, 2015

(86) PCT No.: PCT/CN2015/091821
§ 371 (c)(1),
(2) Date: Mar. 17, 2017

(87) PCT Pub. No.: WO2016/188015
PCT Pub. Date: Dec. 1, 2016

(65) Prior Publication Data
US 2017/0219896 A1    Aug. 3, 2017

(30) Foreign Application Priority Data

May 25, 2015    (CN) .......................... 2015 1 0272658

(51) Int. Cl.
*G02F 1/1362*    (2006.01)
*G02F 1/1333*    (2006.01)
(Continued)

(52) U.S. Cl.
CPC ...... *G02F 1/136286* (2013.01); *G02F 1/1362* (2013.01); *G02F 1/1368* (2013.01);
(Continued)

(58) Field of Classification Search
CPC ............... H01L 27/124; H01L 27/1248; H01L 29/66765; H01L 29/78669; H01L 27/1222;
(Continued)

(56) References Cited

U.S. PATENT DOCUMENTS

| | | | |
|---|---|---|---|
| 2002/0131003 A1 | 9/2002 | Matsumoto | |
| 2004/0119406 A1* | 6/2004 | Kobayashi | .......... H01L 27/3211 313/506 |

(Continued)

FOREIGN PATENT DOCUMENTS

| | | | |
|---|---|---|---|
| CN | 103077944 A | 5/2013 | |
| CN | 103176302 A | 6/2013 | |

(Continued)

OTHER PUBLICATIONS

Search Report for International Application No. PCT/CN2015/091821 dated Jan. 29, 2010.

(Continued)

*Primary Examiner* — Galina G Yushina
(74) *Attorney, Agent, or Firm* — Calfee, Halter & Griswold LLP

(57) ABSTRACT

The present disclosure provides an array substrate, a method of manufacturing the same, a display panel and a display device. The array substrate comprises a plurality of gate lines and a plurality of data lines arranged to cross with each other and define a plurality of pixel areas, each of the pixel areas comprising a thin film transistor. The array substrate further comprises a first insulating layer arranged above the thin film transistors and the data lines; a metal layer arranged above the first insulating layer; a second insulating layer arranged above the metal layer; and a pixel electrode and a common electrode arranged above the second insulating layer, between which a third insulating layer is provided.

(Continued)

The common electrode in each of the pixel areas at least comprises two slits and the metal layer overlies the data lines.

19 Claims, 8 Drawing Sheets

(51) Int. Cl.
   *H01L 27/12* (2006.01)
   *H01L 29/66* (2006.01)
   *G02F 1/1335* (2006.01)
   *G02F 1/1343* (2006.01)
   *G02F 1/1368* (2006.01)
   *H01L 29/786* (2006.01)

(52) U.S. Cl.
   CPC .... *G02F 1/13439* (2013.01); *G02F 1/133345* (2013.01); *G02F 1/133514* (2013.01); *G02F 1/136227* (2013.01); *H01L 27/124* (2013.01); *H01L 27/1222* (2013.01); *H01L 27/1248* (2013.01); *H01L 27/1262* (2013.01); *H01L 29/66765* (2013.01); *H01L 29/78669* (2013.01); *G02F 2001/134372* (2013.01); *G02F 2001/136218* (2013.01); *G02F 2001/136295* (2013.01); *G02F 2201/121* (2013.01); *G02F 2201/123* (2013.01)

(58) Field of Classification Search
   CPC ....... H01L 27/122205; G02F 1/136286; G02F 1/1368; G02F 1/133345; G02F 1/136227; G02F 1/133514; G02F 1/13439; G02F 2201/123; G02F 2201/121; G02F 2001/136295

See application file for complete search history.

(56) References Cited

U.S. PATENT DOCUMENTS

| | | |
|---|---|---|
| 2013/0162570 A1 | 6/2013 | Shin et al. |
| 2014/0159086 A1* | 6/2014 | Yu .................... G02F 1/136209 257/98 |
| 2015/0249197 A1* | 9/2015 | Shieh .................... H01L 33/642 257/72 |
| 2015/0311232 A1 | 10/2015 | Sun et al. |
| 2015/0325705 A1 | 11/2015 | Choi et al. |
| 2016/0011466 A1* | 1/2016 | Choi ................. G02F 1/136227 257/72 |

FOREIGN PATENT DOCUMENTS

| | | |
|---|---|---|
| CN | 103309105 A | 9/2013 |
| CN | 103472646 A | 12/2013 |
| CN | 103676374 A | 3/2014 |
| CN | 104834139 A | 8/2015 |

OTHER PUBLICATIONS

First Office Action for China Application No. 201510272658.2 dated Apr. 18, 2017.

Second Office Action for Chinese Patent Application No. 201510272658.2 dated Jan. 25, 2018.

* cited by examiner

ARRAY SUBSTRATE AND METHOD OF MANUFACTURING THE SAME, DISPLAY PANEL AND DISPLAY DEVICE

RELATED APPLICATIONS

The present application is the U.S. national phase entry of PCT/CN2015/091821, with an international filing date of Oct. 13, 2015, which claims the benefit of Chinese Patent Applications No. 201510272658.2, filed on May 25, 2015, the entire disclosures of which are incorporated herein by reference.

FIELD

The present disclosure relates to the field of liquid crystal display technologies, and particularly to an array substrate, a method of manufacturing the same, a display panel and a display device.

BACKGROUND

With the development of liquid crystal display technologies, a flat panel display has become a mainstream product in the field of displays in place of a cathode ray tube (CRT) display. At present, a commonly used flat panel display includes a liquid crystal display (LCD) and an organic light-emitting diode (OLED) display. During the process of imaging, each liquid crystal pixel point in the LCD display is integrated with a thin film transistor (TFT) for driving, which achieves image display in cooperation with a peripheral driving circuit.

SUMMARY

The present disclosure provides an array substrate, a method of manufacturing the same, a display panel and a display device, which can at least partially alleviate or eliminate the problems in the prior art. Specifically, it enables at least two common electrode slits to be formed, which increases the liquid crystal efficiency while avoiding the problem of color mixing resulting from the interaction between adjacent pixels.

A first aspect of the present disclosure provides an array substrate. The array substrate may comprise a plurality of gate lines and a plurality of data lines arranged to cross with each other and define a plurality of pixel areas, each of the pixel areas comprising a thin film transistor. The array substrate further comprises a first insulating layer arranged above the thin film transistors and the data lines; a metal layer arranged above the first insulating layer; a second insulating layer arranged above the metal layer; and a pixel electrode and a common electrode arranged above the second insulating layer, between which a third insulating layer is provided. The common electrode in each of the pixel areas at least comprises two slits. The metal layer overlies the data lines, the pixel electrode is electrically connected to a first terminal of the thin film transistor via a via hole at least penetrating the first insulating layer and the second insulating layer, and the first terminal is a source electrode or a drain electrode.

According to an embodiment, the metal layer may be electrically connected to the common electrode via a via hole penetrating the second insulating layer and the third insulating layer.

According to another embodiment, the metal layer may comprise any one or more of molybdenum, copper, and aluminum.

According to a further embodiment, a width of the metal layer may be larger than a width of the data line, and a center of the width of the metal layer and a center of the width of the data line are located on a same straight line.

According to yet another embodiment, the width of the metal layer may be 3 to 4 µm.

According to a further embodiment, a distance between an edge of the metal layer and an edge of the data line may be 0.8 to 1.5 µm.

According to embodiments, a distance between adjacent data lines may be not greater than 14 µm.

A second aspect of the present disclosure provides a display panel, which may comprise a color substrate and the above array substrate arranged opposite to each other.

A third aspect of the present disclosure provides a display device, which may comprise the above display panel.

A fourth aspect of the present disclosure provides a method of manufacturing an array substrate, which may comprise:

forming a pattern comprising a first terminal, a second terminal and data lines, the first terminal and the second terminal being one of a source electrode and a drain electrode, respectively;

forming a first insulating layer above the data lines;

forming a metal layer, the metal layer being located above the first insulating layer and overlying the data lines;

forming a second insulating layer above the metal layer, and forming a via hole at least penetrating the first insulating layer and the second insulating layer;

forming a pixel electrode, the pixel electrode being located above the second insulating layer, and the pixel electrode being electrically connected to the first terminal via the via hole at least penetrating the first insulating layer and the second insulating layer;

forming a third insulating layer above the pixel electrode;

forming a common electrode, the common electrode being located above the third insulating layer and at least comprising two slits.

According to an embodiment, the method of manufacturing an array substrate may further comprise:

forming a via hole at least penetrating the second insulating layer and the third insulating layer, the metal layer being electrically connected to the common electrode via the via hole at least penetrating the second insulating layer and the third insulating layer.

According to another embodiment, prior to the step of forming a pattern comprising a first terminal, a second terminal and data lines, the method may further comprise:

forming a gate on a base substrate;

depositing a gate insulating layer on the gate;

forming an active layer on the gate insulating layer.

In the array substrate, the method of manufacturing the same, the display panel and the display device provided by embodiments of the present disclosure, the array substrate is provided with a metal layer to realize the function of the light-shielding portion of the common electrode in the conventional array substrate. In this way, when the common electrode is being formed, a plurality of slits can be formed as practically required, thereby reducing the interaction between adjacent pixels, increasing the liquid crystal efficiency and decreasing the driving voltage.

Other features and advantages of the present disclosure will be set forth in the description below, and partly become apparent from the description, or may be learned by implementing the present disclosure. The objectives and other advantages of the present disclosure may be realized and obtained by the structure particularly pointed out in the description, claims and drawings.

BRIEF DESCRIPTION OF DRAWINGS

The drawings described herein serve to provide a further understanding of the present disclosure and form part of the present disclosure. The illustrative embodiments of the present disclosure and their description serve to explain the present disclosure and do not limit the present disclosure in an inappropriate manner. In the drawings.

DETAILED DESCRIPTION

Figure 1:
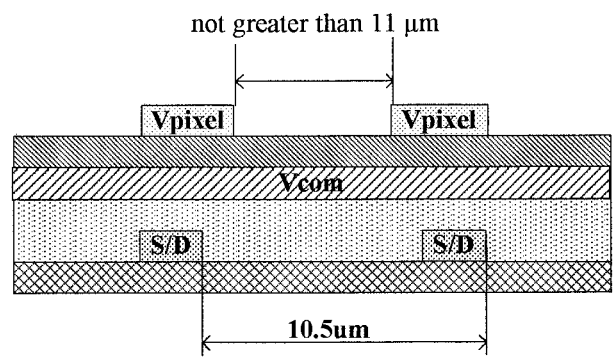
FIG. 1 is a schematic diagram of an array substrate in the prior art.
Figure 2:
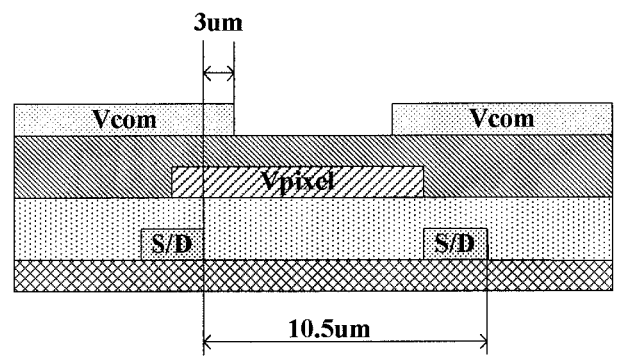
FIG. 2 is a schematic diagram of an array substrate having a PCI structure in the prior art.

In an Advanced Super Dimension Switch (ADS) mode, two layers of transparent electrodes (made of indium tin oxide ITO) are formed on an array substrate. Usually, one layer of the ITO electrodes is used as a common electrode (Vcom), while the other is used as a pixel electrode (Vpixel). In a conventional structure, the pixel electrode is usually located above the common electrode, as shown in FIG. 1. In this structure, the common electrode is a structure without slit. Since in the structure without slit, a pixel is interfered with by the electric field of a pixel next to it, color mixing is liable to take place. In order to solve this problem, the prior art proposes a pixel inversion (PCI) structure, i.e. the common electrode is located above the pixel electrode as shown in FIG. 2. However, in the PCI structure, since line-by-line scanning is performed on the gate lines, all the data lines would be turned on when each row of gate line is being scanned. In order to prevent the liquid crystal molecules from being deflected by the electric field formed due to the turn-on of the data lines, a light-shielding portion (a portion between edges of the common electrode and the gate line/data line (S/D)) is formed by means of the common electrode, the width of which needs to be no less than 3 μm. In this way, at most one slit can be formed between the common electrodes, which decreases the liquid crystal efficiency such that the driving voltage is increased.

In order to avoid the problem of color mixing resulting from the interaction between adjacent pixels, embodiments of the present invention provide an array substrate, a method of manufacturing the same, a display panel, and a display device.

Exemplary embodiments of the present disclosure are described below with reference to the accompanying drawings. It is to be understood that the exemplary embodiments described herein are only for the purpose of illustrating and explaining the present disclosure, rather than limiting the present disclosure, and that embodiments of the present disclosure and features therein may be combined with each other without causing conflict.

An array substrate provided by an embodiment of the present disclosure comprises a plurality of gate lines and a plurality of data lines arranged to cross with each other and define a plurality of pixel areas, each of the pixel areas comprising a thin film transistor.

Figure 3:
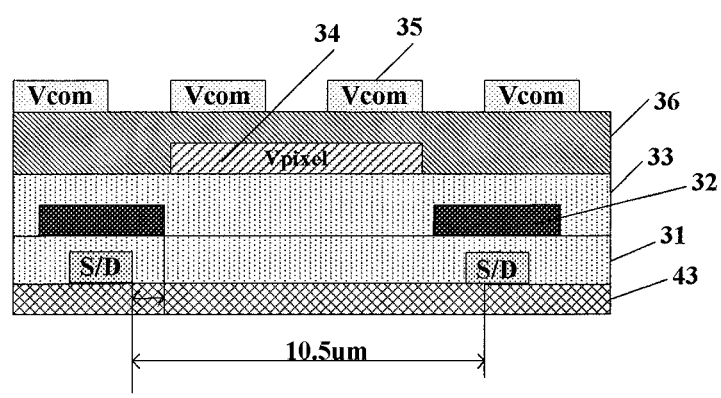
FIG. 3 is a schematic sectional diagram of an array substrate according to embodiments of the present disclosure.

As shown in FIG. 3, the array substrate further comprises a first insulating layer 31 arranged above the thin film transistor and the data lines; a metal layer 32 arranged above the first insulating layer; a second insulating layer 33 arranged above the metal layer 32; and a pixel electrode 34 and a common electrode 35 arranged above the second insulating layer. A third insulating layer 36 is provided between the pixel electrode 34 and the common electrode 35, and the common electrode 35 in each pixel area at least comprises two slits. Upon specific implementation, the metal layer 32 overlies the data lines, and the pixel electrode 34 is electrically connected to the drain electrode of the thin film transistor via a via hole penetrating the first insulating layer 31 and the second insulating layer 33.

It is to be noted that, although in the above embodiment the pixel electrode 34 is electrically connected to the drain electrode of the thin film transistor via a via hole penetrating the first insulating layer 31 and the second insulating layer 33, in an alternative embodiment, the pixel electrode 34 is electrically connected to the source electrode of the thin film transistor via a via hole penetrating the first insulating layer 31 and the second insulating layer 33.

Upon specific implementation, the metal layer 32 may be electrically connected to the common electrode 35 via a via hole penetrating the second insulating layer 33 and the third insulating layer 36.

Upon specific implementation, the metal layer 32 may employ a metal having small resistance or an alloy of several metals, which is not limited in embodiments of the present disclosure. For example, the metal layer may employ one or more of the metals: molybdenum, copper, aluminum, and the like. It is to be noted that when the metal layer employs a low reflective metal such as molybdenum, it can actually act as a black matrix (BM) (i.e. light-shielding portion) since the metal blocks light. On such basis, in embodiments of the present disclosure, the width of BM of the color substrate can be reduced or a color substrate without BM can be used.

Upon specific implementation, the center of the width of the metal layer is located on the same straight line as the center of the width of the data line, and the distance between the edge of the metal layer and the edge of the data line is, for example, 0.8 to 1.5 μm. When the width of the data line is 2 μm, the width of the metal layer can be formed into about 3 to 4 μm.

It is to be noted that the array substrate provided by embodiments of the present disclosure is particularly applicable to the case of ultra-high resolution (600 to 800 PPI), that is, the distance between adjacent data lines is not greater than 14 μm.

Figure 5A:
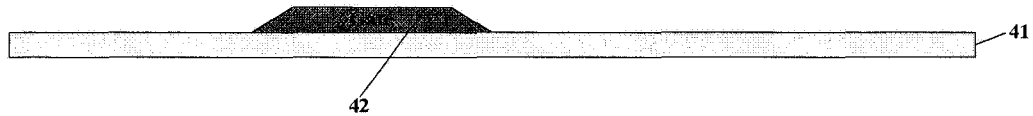
FIGS. 5a-5j are schematic diagrams in the process of manufacturing an array substrate according to embodiments of the present disclosure.
Figure 5B:
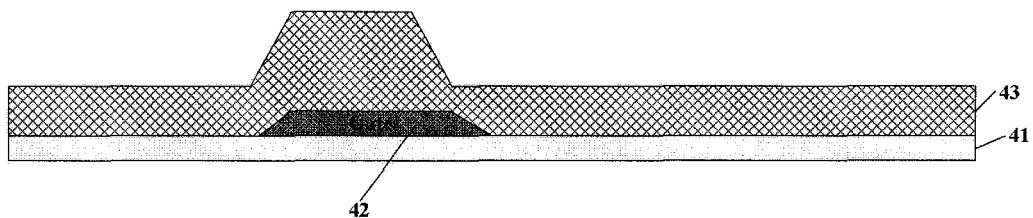
Figure 5C:
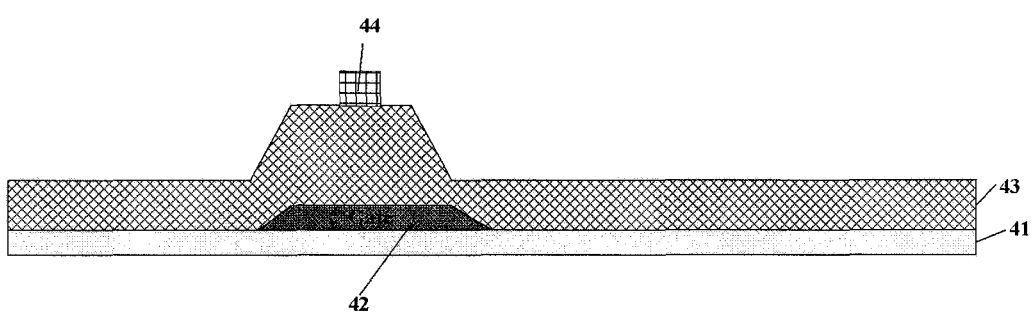
Figure 5D:
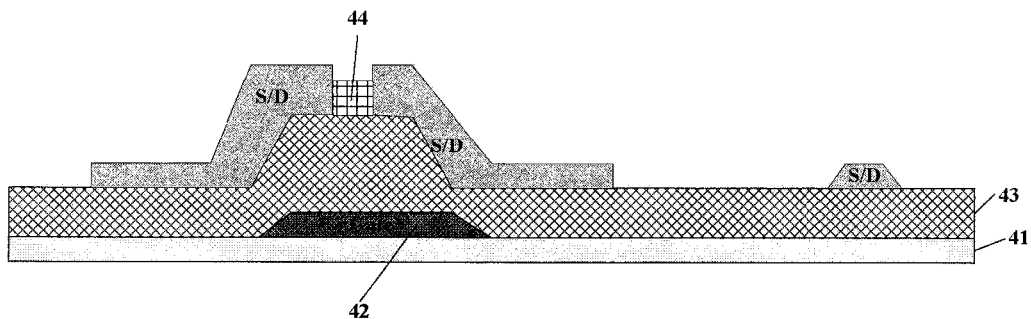
Figure 5E:
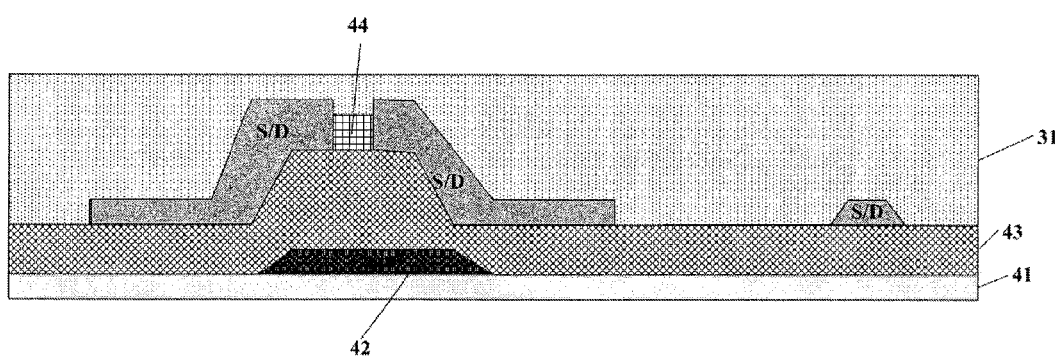
Figure 5F:
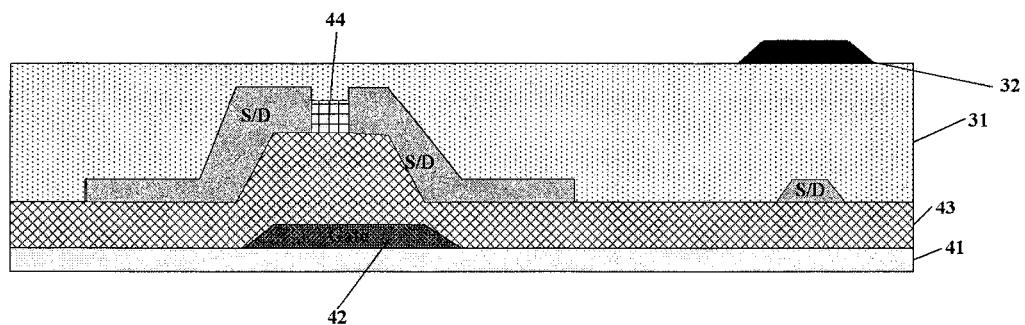
Figure 5G:
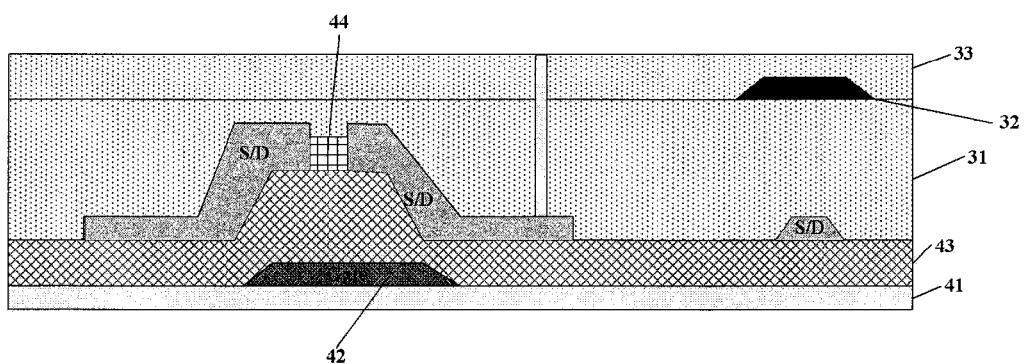
Figure 5H:
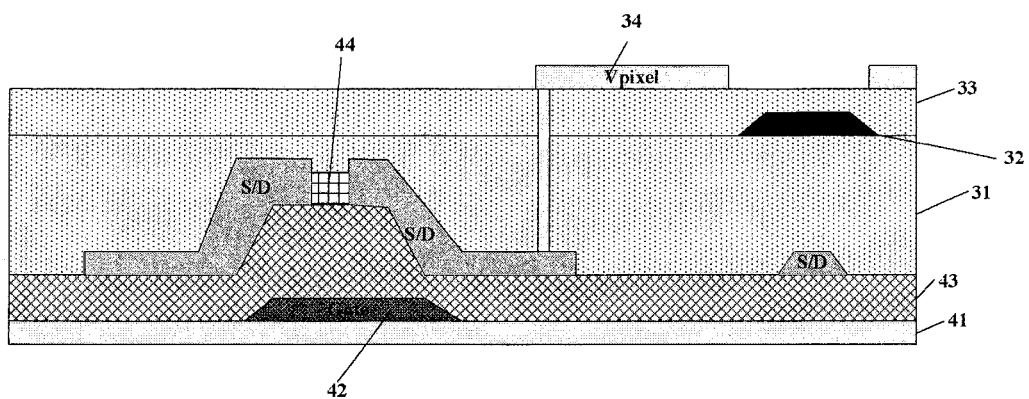
Figure 5I:
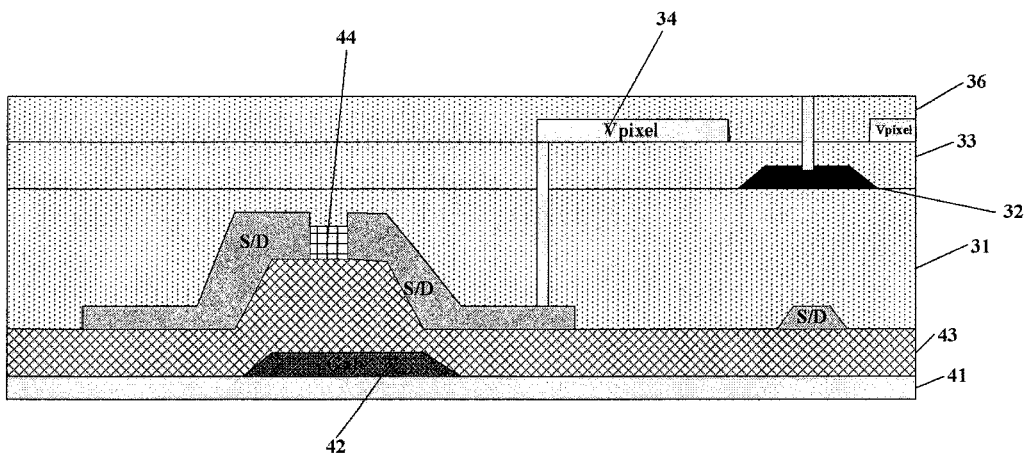

Upon specific implementation, the above array substrate may further comprise a glass substrate 41, a gate 42, a gate insulating layer 43 and an active layer 44, as shown in FIG. 5i, wherein the gate 42 is located on the glass substrate 41, the gate insulating layer 43 is located above the gate 42, and the active layer 44 is located above the gate insulating layer. The data lines are provided in the same layer as the source/drain electrode (S/D), and the gate lines are provided in the same layer as the gate 42. The first insulating layer 31 is arranged above the gate lines and the data lines, the metal layer 32 is arranged above the first insulating layer 31, the second insulating layer 33 is arranged above the metal layer 32, the pixel electrode 34 and the common electrode 35 (not shown) are arranged above the second insulating layer 33, and a third insulating layer 36 is provided between the pixel electrode 34 and the common electrode 35.

The array substrate provided by embodiments of the present disclosure is further added with a second insulating layer as compared to the array substrate using a PCI structure. Upon specific implementation, when the first insulating layer is formed, the thickness thereof may be half the thickness of that in the existing PCI structure or less.

In embodiments of the present disclosure, the function of the light-shielding portion in the conventional PCI structure is realized by the metal layer so that there is no need to take into account the distance between edges of the common electrode and the data line when the common electrode is being formed, thereby a plurality of slits can be formed as practically required. Consequently, the liquid crystal efficiency can be increased and the driving voltage can be decreased while avoiding the problem of color mixing resulting from the interaction between adjacent pixels.

On the basis of the same inventive concept, embodiments of the present disclosure further provide a method of manufacturing an array substrate, a display panel, and a display device. Since the principles of the above method and device for solving the problem are similar to those of the above array substrate, the implementations thereof may refer to the implementation of the array substrate, and are not further described.

Figure 4:
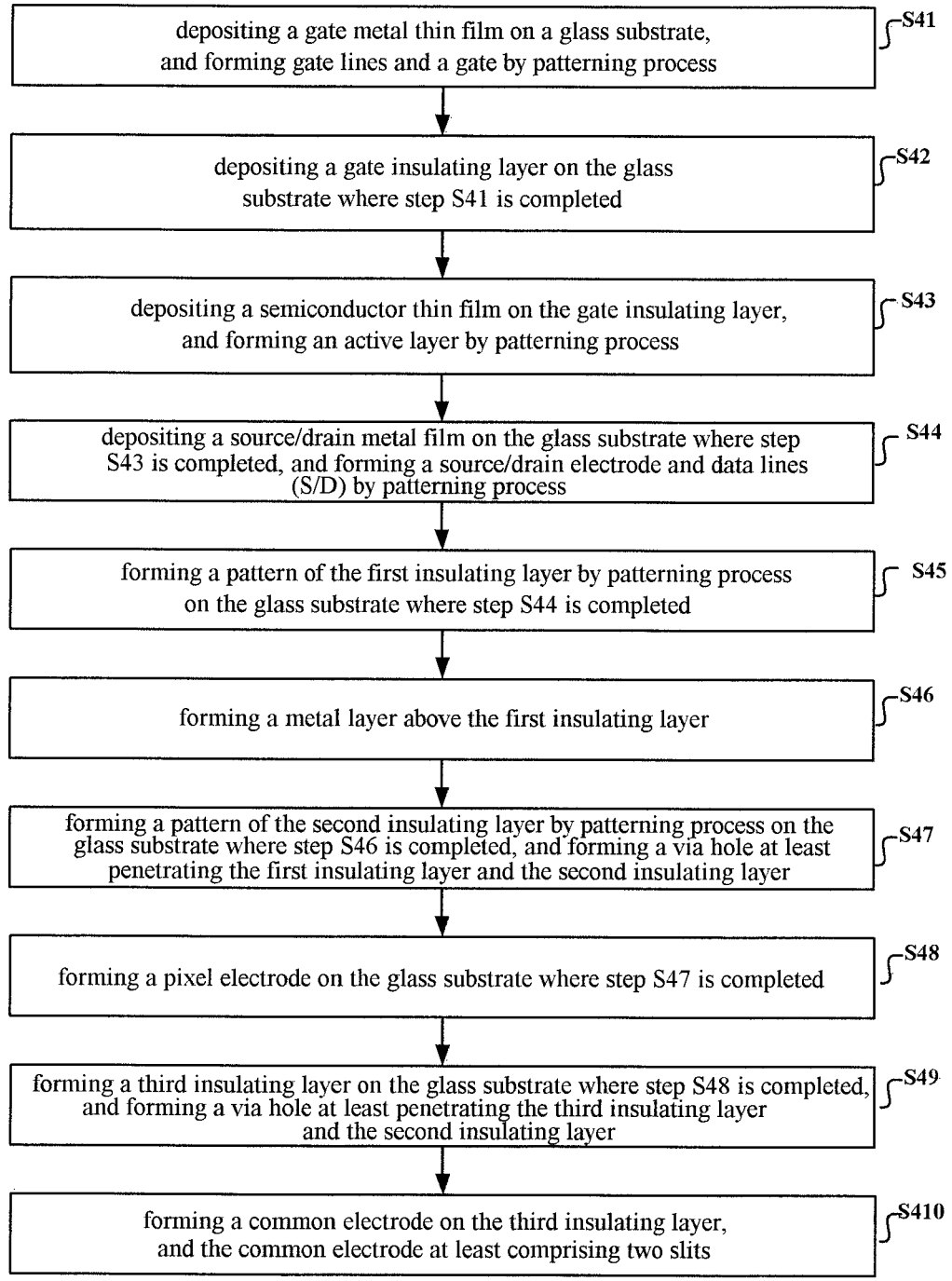
FIG. 4 is a schematic diagram of a flow for carrying out a method of manufacturing an array substrate according to embodiments of the present disclosure.

As shown in FIG. 4 which is a schematic diagram of a flow for carrying out the method of manufacturing an array substrate as provided by embodiments of the present disclosure, the method may comprise the steps below.

At S41, a gate metal thin film is deposited on a glass substrate, and gate lines and a gate are formed by patterning process.

Upon specific implementation, a schematic diagram of the structure of the glass substrate after the treatment of step S41 is shown in FIG. 5a. It is to be noted that FIG. 5a is a cross-sectional view of the glass substrate in which gate lines are not shown.

At S42, a gate insulating layer is deposited on the glass substrate where step S41 is completed.

Upon specific implementation, a schematic diagram of the structure of the glass substrate after the treatment of step S42 is shown in FIG. 5b.

At S43, a semiconductor thin film is deposited on the gate insulating layer, and an active layer is formed by patterning process.

Upon specific implementation, a schematic diagram of the structure of the glass substrate after the treatment of step S43 is shown in FIG. 5c. During specific implementation, in order to reduce the contact resistance between the active layer and the source/drain electrode, the active layer may be a two-layer structure. Specifically, a doped semiconductor thin film is deposited on the gate insulating layer, and an ohmic contact layer between the active layer and the source electrode as well as the drain electrode is formed by patterning process to improve the performance of the TFT. For example, in the case of making an active layer using an amorphous silicon semiconductor layer material, a nitrogen ion-doped amorphous silicon layer (N+a-Si) may be made between the active layer and the source electrode as well as the drain electrode.

Upon specific implementation, the active layer may also be a metal oxide semiconductor such as indium gallium zinc oxide (IZGO).

At S44, a source/drain electrode metal film is deposited on the glass substrate where step S43 is completed, and a source/drain electrode and data lines (S/D) are formed by patterning process.

Upon specific implementation, a schematic diagram of the structure of the glass substrate after the treatment of step S44 is shown in FIG. 5d.

At S45, a pattern of the first insulating layer is formed by patterning process on the glass substrate where step S44 is completed.

Upon specific implementation, a schematic diagram of the structure of the glass substrate after the treatment of step S45 is shown in FIG. 5e.

At S46, a metal layer is formed above the first insulating layer.

The metal layer is located above the first insulating layer and overlies the data lines. Upon specific implementation, a schematic diagram of the structure of the glass substrate after the treatment of step S46 is shown in FIG. 5f.

At S47, a pattern of the second insulating layer is formed by patterning process on the glass substrate where step S46 is completed, and a via hole at least penetrating the first insulating layer and the second insulating layer is formed.

Upon specific implementation, a schematic diagram of the structure of the glass substrate after the treatment of step S47 is shown in FIG. 5g.

At S48, a pixel electrode is formed on the glass substrate where step S47 is completed.

The pixel electrode is located above the second insulating layer and is electrically connected to the drain electrode via a via hole at least penetrating the first insulating layer and the second insulating layer. Upon specific implementation, a schematic diagram of the structure of the glass substrate after the treatment of step S48 is shown in FIG. 5h.

Upon specific implementation, the pixel electrode may be an indium tin oxide (ITO) or an indium zinc oxide (IZO).

At S49, a third insulating layer is formed on the glass substrate where step S48 is completed, and a via hole at least penetrating the third insulating layer and the second insulating layer is formed.

The metal layer is electrically connected to the common electrode via the via hole at least penetrating the second insulating layer and the third insulating layer. Upon specific implementation, a schematic diagram of the structure of the glass substrate after the treatment of step S49 is shown in FIG. 5i.

At S410, a common electrode is formed on the third insulating layer and at least comprises two slits.

The common electrode is located above the third insulating layer.

Figure 5J:
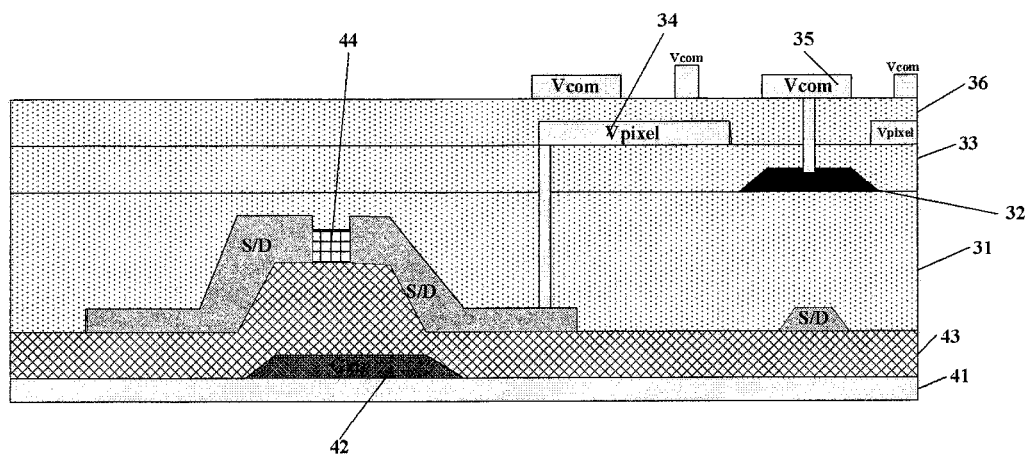

Upon specific implementation, a schematic diagram of the structure of the glass substrate after the treatment of step S410 is shown in FIG. 5j.

It is to be noted that the flow shown in FIG. 4 is a flow chart for manufacturing an array substrate of a bottom gate structure. Upon specific implementation, the array substrate may also be a top gate structure. During the process of manufacturing an array substrate of a top gate structure, the gate is located above the active layer.

Upon specific implementation, the common electrode may employ an indium tin oxide (ITO) or indium zinc oxide (IZO), and so on.

Embodiments of the present disclosure further provide a display panel comprising the array substrate described above and a color substrate, wherein the array substrate and the color substrate are arranged in cell alignment and a liquid crystal is filled therebetween.

Particularly, if the metal layer in the array substrate provided in embodiments of the present disclosure is implemented using a low reflective metal such as molybdenum, the color substrate included in the display panel provided by embodiments of the present disclosure may employ a color substrate without BM or a color substrate whose BM width is reduced.

Embodiments of the present disclosure further provide a display device comprising the above display panel.

Although exemplary embodiments of the present disclosure have been described, those skilled in the art, upon learning the basic inventive concept, may make other variations and modifications to these embodiments. Therefore, the appended claims are intended to be interpreted as including exemplary embodiments and all variations and modifications that fall within the scope of the present disclosure.

Apparently, those skilled in the art can make various modifications and variations to the present disclosure without departing from the spirit and scope thereof. In this way, if these modifications and variations to the present disclosure fall within the scope of the claims of the present disclosure and equivalent technologies thereof, the present disclosure also intends to encompass these modifications and variations.

The invention claimed is:

1. An array substrate comprising:
   a plurality of thin film transistors,
   a plurality of gate lines and a plurality of data lines arranged to cross with each other and define a plurality of pixel areas, each of the pixel areas comprising one of the plurality of thin film transistors,
   a first insulating layer arranged above the plurality of thin film transistors and the data lines,
   a metal layer arranged above the first insulating layer and overlying the data lines,
   a second insulating layer arranged above the metal layer, and
   pixel electrodes and common electrodes arranged above the second insulating layer; a third insulating layer is provided between each of the pixel electrode and a corresponding common electrode,
   wherein, in each of the pixel areas:
   a common electrode at least comprises two slits,
   a pixel electrode is electrically connected to a first terminal of a thin film transistor via a via hole at least penetrating the first insulating layer and the second insulating layer, and
   the first terminal is a source electrode or a drain electrode, and
   a portion of the metal layer overlies a data line, and
   wherein, the metal layer is configured with a function of light-shielding.

2. The array substrate according to claim 1, wherein the portion of the metal layer is electrically connected to the common electrode via a via hole penetrating the second insulating layer and the third insulating layer.

3. The array substrate according to claim 1, wherein the metal layer comprises any one or more of molybdenum, copper, and aluminum.

4. The array substrate according to claim 1, wherein a width of the portion of the metal layer is larger than a width of the data line, and a center of the width of the portion of the metal layer and a center of the width of the data line are located on a same straight line.

5. The array substrate according to claim 4, wherein the width of the portion of the metal layer is 3 to 4 µm.

6. The array substrate according to claim 1, wherein a distance between an edge of the portion of the metal layer and an edge of the data line is 0.8 to 1.5 µm.

7. The array substrate according to claim 1, wherein a distance between adjacent data lines is not greater than 14 µm.

8. A display panel comprising: a color substrate and the array substrate according to claim 1 arranged opposite to each other.

9. A display device comprising the display panel according to claim 8.

10. The display panel according to claim 8, wherein the portion of the metal layer is electrically connected to each the common electrode via a via hole penetrating the second insulating layer and the third insulating layer.

11. The display panel according to claim 8, wherein the metal layer comprises any one or more of molybdenum, copper; and aluminum.

12. The display panel according to claim 8, wherein a width of the portion of the metal layer is larger than a width of the data line, and a center of the width of the portion of the metal layer and a center of the width of the data line are located on a same straight line.

13. The display panel according to claim 12, wherein the width of the portion of the metal layer is 3 to 4 µm.

14. The display panel according to claim 8, wherein a distance between an edge of the portion of the metal layer and an edge of the data line is 0.8 to 1.5 µm.

15. The display panel according to claim 8, wherein a distance between adjacent data lines is not greater than 14 µm.

16. A method of manufacturing an array substrate comprising:
   forming a pattern comprising a first terminal, a second terminal and a data line, the first terminal and the second terminal being one of a source electrode and a drain electrode, respectively;
   forming a first insulating layer above the data line;
   forming a metal layer above the first insulating layer, wherein a portion of the metal layer overlies the data line;
   forming a second insulating layer above the metal layer, and forming a via hole at least penetrating the first insulating layer and the second insulating layer;
   forming a pixel electrode, the pixel electrode being located above the second insulating layer, and the pixel electrode being electrically connected to the first terminal via the via hole at least penetrating the first insulating layer and the second insulating layer;
   forming a third insulating layer above the pixel electrode;
   forming a common electrode, the common electrode being located above the third insulating layer and at least comprising two slits,
   wherein, the metal layer is configured with a function of light-shielding.

17. The method according to claim 16, further comprising:
   forming a via hole at least penetrating the second insulating layer and the third insulating layer, the portion of the metal layer being electrically connected to the common electrode via the via hole at least penetrating the second insulating layer and the third insulating layer.

18. The method according to claim 16, prior to the step of forming a pattern comprising a first terminal, a second terminal and a data line, further comprising:
   forming a gate on a base substrate;

depositing a gate insulating layer on the gate;
forming an active layer on the gate insulating layer.

19. The method according to claim 17, prior to the step of forming a pattern comprising a first terminal, a second terminal and a data line, further comprising:
    forming a gate on a base substrate;
    depositing a gate insulating layer on the gate;
    forming an active layer on the gate insulating layer.

* * * * *